(12) United States Patent
Tamura

(10) Patent No.: US 9,372,240 B2
(45) Date of Patent: Jun. 21, 2016

(54) CURRENT SENSOR

(71) Applicant: ALPS GREEN DEVICES CO., LTD., Tokyo (JP)

(72) Inventor: Manabu Tamura, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 58 days.

(21) Appl. No.: 14/284,234

(22) Filed: May 21, 2014

(65) Prior Publication Data

US 2015/0015241 A1  Jan. 15, 2015

(30) Foreign Application Priority Data

Jul. 10, 2013  (JP) ................. 2013-144456

(51) Int. Cl.
| | |
|---|---|
| G01R 19/00 | (2006.01) |
| G01R 33/09 | (2006.01) |
| G01R 15/20 | (2006.01) |
| G01R 1/18 | (2006.01) |

(52) U.S. Cl.
CPC .............. *G01R 33/091* (2013.01); *G01R 15/20* (2013.01); *G01R 15/202* (2013.01); *G01R 1/18* (2013.01)

(58) Field of Classification Search
CPC .... G01R 33/091; G01R 15/202; G01R 15/20; G01R 1/18
See application file for complete search history.

(56) References Cited

U.S. PATENT DOCUMENTS

| | | | | |
|---|---|---|---|---|
| 5,552,700 | A * | 9/1996 | Tanabe ............... | G01R 19/0092 324/117 H |
| 5,583,429 | A * | 12/1996 | Otaka .................. | G01R 15/202 324/117 H |
| 2010/0237853 | A1 * | 9/2010 | Bose .................... | G01R 33/025 324/117 H |
| 2011/0050222 | A1 * | 3/2011 | Ueno ................... | G01R 15/207 324/253 |
| 2011/0068771 | A1 * | 3/2011 | Ueno ................... | G01R 15/202 324/117 R |
| 2011/0298454 | A1 * | 12/2011 | Ausserlechner ..... | G01R 15/207 324/252 |
| 2014/0077797 | A1 * | 3/2014 | Nagao ................. | G01R 15/207 324/253 |

FOREIGN PATENT DOCUMENTS

JP  2012-122793  6/2012

* cited by examiner

*Primary Examiner* — Patrick Assouad
*Assistant Examiner* — Demetrius Pretlow
(74) *Attorney, Agent, or Firm* — Beyer Law Group LLP

(57) ABSTRACT

A current sensor according to the present invention includes a bus bar, a magnetic sensor element disposed so as to face the bus bar, a wiring board on which the magnetic sensor element is provided, and a signal line electrically connected to the magnetic sensor element. The wiring board includes a base portion facing the bus bar and an extending portion extending from the base portion, and the signal line is connected to the extending portion and provided in a direction intersecting the wiring board.

9 Claims, 8 Drawing Sheets

Prior Art

CURRENT SENSOR

CLAIM OF PRIORITY

This application claims benefit of Japanese Patent Application No. 2013-144456 filed on Jul. 10, 2013, which is hereby incorporated by reference.

BACKGROUND OF THE INVENTION

1. Field of the Invention

The present invention relates to a current sensor, and particularly relates to a current sensor having a signal line from which a detected signal is transmitted to the outside.

2. Description of the Related Art

A current sensor that measures a current flowing through a bus bar (a measured current path) is used in order to control or monitor various electric apparatuses. As such a current sensor, a sensor is known which includes a magnetic sensor element that detects a magnetic field generated around a current. Japanese Unexamined Patent Application Publication No. 2012-122793 discloses a current sensor including a Hall element as a magnetic sensor element.

FIG. 8 is a perspective view of a current sensor of the related art described in Japanese Unexamined Patent Application Publication No. 2012-122793. As shown in FIG. 8, the current sensor 110 of the related art includes a long plate-shaped bus bar 111 composed of a conductor, a core 112 surrounding the bus bar 111, and a Hall IC (Integrated Circuit) 113.

In the current sensor 110 of the related art, the Hall IC 113 is configured to house a Hall element and an IC in one package and is able to detect a magnetic flux passing through a magnetosensitive surface 113a of the Hall IC 113. As shown in FIG. 8, a gap 112a is provided in the core 112, and the Hall IC 113 is inserted in the gap 112a and disposed on the bus bar 111.

When a measured current flows through the bus bar 111, a magnetic field is generated around the bus bar 111 to form a magnetic path in the core 112. The gap 112a is provided so as to be orthogonal to the magnetic path, and a magnetic flux passing along the magnetic path passes through the magnetosensitive surface 113a of the Hall IC 113. Thus, it is possible to detect the current flowing through the bus bar 111. In addition, as shown in FIG. 8, a plurality of terminals 120a to 120d are provided to the Hall IC 113. A plurality of terminals or signal lines are connected to the plurality of terminals 120a to 120d, and an output signal of the Hall IC 113 is transmitted to the outside therethrough.

However, the plurality of terminals 120a to 120d extend parallel to the bus bar 111 and in a direction parallel to the magnetosensitive surface 113a. Thus, capacitances are formed between the plurality of terminals 120a to 120d and the bus bar 111 so that the plurality of terminals 120a to 120d and the bus bar 111 are capacitively coupled to each other.

Therefore, when a voltage applied to the bus bar 111 varies, a signal transmitted through the plurality of terminals 120a to 120d to the outside change to generate an output error. In addition, in the case where signal lines or the like (not shown) are connected to the plurality of terminals 120a to 120d, capacitive coupling occurs between the bus bar 111 and the signal lines or the like, and entire capacitive coupling with the plurality of terminals 120a to 120d and the signal lines or the like is increased. Thus, change in an output signal easily occurs due to voltage variation in the bus bar 111.

Furthermore, the plurality of terminals 120a to 120d and the signal lines or the like are disposed near the bus bar 111.

Thus, electromagnetic noise generated by a current flowing through the bus bar 111 is superimposed on the plurality of terminals 120a to 120d and the signal lines or the like, and an output error is increased.

SUMMARY OF THE INVENTION

The present invention provides a current sensor that solves the above-described problems and is able to reduce an output error.

A current sensor according to the present invention includes: a bus bar; a magnetic sensor element disposed so as to face the bus bar; a wiring board on which the magnetic sensor element is provided; and a signal line electrically connected to the magnetic sensor element. The wiring board includes a base portion facing the bus bar and an extending portion extending from the base portion, and the signal line is connected to the extending portion and provided in a direction intersecting the wiring board.

According to this, since the signal line is connected to the extending portion of the wiring board, the signal line is provided in the direction intersecting the bus bar and disposed at a position away from the bus bar. Thus, the effective facing area of the signal line and the bus bar is decreased, the distance between the signal line and the bus bar is increased, and hence capacitive coupling between the bus bar and the signal line is suppressed. Therefore, change in an output signal is reduced even when voltage variation occurs in the bus bar. In addition, since the distance between the signal line and the bus bar is increased, it is possible to suppress electromagnetic noise from the bus bar, from being superimposed on the signal line.

Therefore, in the current sensor according to the present invention, it is possible to reduce an output error.

In the current sensor according to the present invention, a through hole is preferably formed in the extending portion between the bus bar and the signal line. According to this, since the through hole is provided, it is possible to reduce a dielectric constant between the bus bar and the signal line, and thus capacitive coupling between the bus bar and the signal line is effectively suppressed. Therefore, it is possible to reduce an output error caused due to voltage variation in the bus bar.

The current sensor according to the present invention preferably further includes a shield provided between the bus bar and the signal line so as to extend through the through hole. According to this, electromagnetic noise from the bus bar is blocked by the shield, and thus electromagnetic noise is suppressed from being superimposed on the signal line.

Preferably, the bus bar has a first surface facing the magnetic sensor element, a second surface at a side opposite to the first surface, and a pair of side surfaces connecting the first surface to the second surface, and the shield is provided continuously so as to face the second surface and the pair of the side surfaces of the bus bar. According to this, entry of external magnetic noise or electromagnetic noise into the bus bar and the magnetic sensor element is suppressed, and thus an output error is reduced.

The shield preferably includes a bent portion covering the first surface of the bus bar. According to this, it is possible to effectively block external magnetic noise or electromagnetic noise entering from the first surface side, thereby reducing an output error.

The shield is preferably a soft magnetic body. According to this, a magnetic field generated by a current flowing through the signal line is absorbed by the shield, and thus it is possible to prevent the magnetic sensor element from making a false detection.

The shield is preferably a conductor. According to this, electromagnetic noise generated by a current flowing through the bus bar is blocked by the shield, and thus it is possible to suppress the electromagnetic noise from the bus bar, from being superimposed on the signal line.

In the current sensor according to the present invention, preferably, a plurality of the signal lines and a grounded ground line are connected to the extending portion and are arranged in a direction in which the bus bar extends. According to this, even when noise enters, the noise is equally superimposed on all the signal lines and the ground line, and thus it is possible to easily cancel out an effect of the noise. Therefore, it is possible to reduce an error in an output signal extracted from the signal lines.

A length of the base portion in a width direction of the bus bar is preferably shorter than a width dimension of the bus bar. According to this, it is possible to decrease the facing area of the base portion and the bus bar, and thus it is possible to suppress capacitive coupling formed between a wire of the wiring board and the bus bar, thereby suppressing occurrence of an error in an output signal which is caused due to voltage variation in the bus bar or the like.

DESCRIPTION OF THE PREFERRED EMBODIMENTS

Hereinafter, current sensors according to embodiments of the present invention will be described in detail with reference to the drawings. It should be noted that the dimensions in each drawing are changed as appropriate and shown.

First Embodiment

Figure 1:
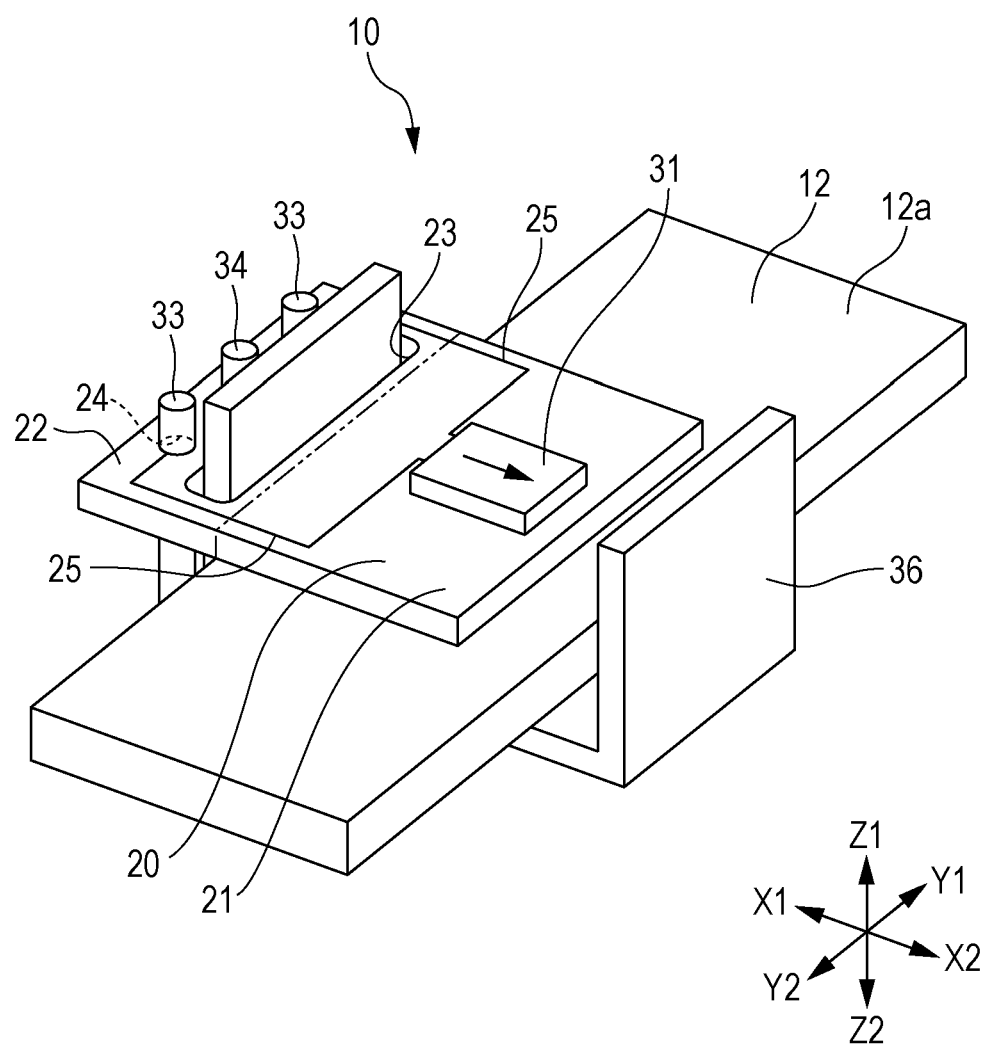
FIG. 1 is a perspective view of a current sensor according to a first embodiment of the present invention.
Figure 2:
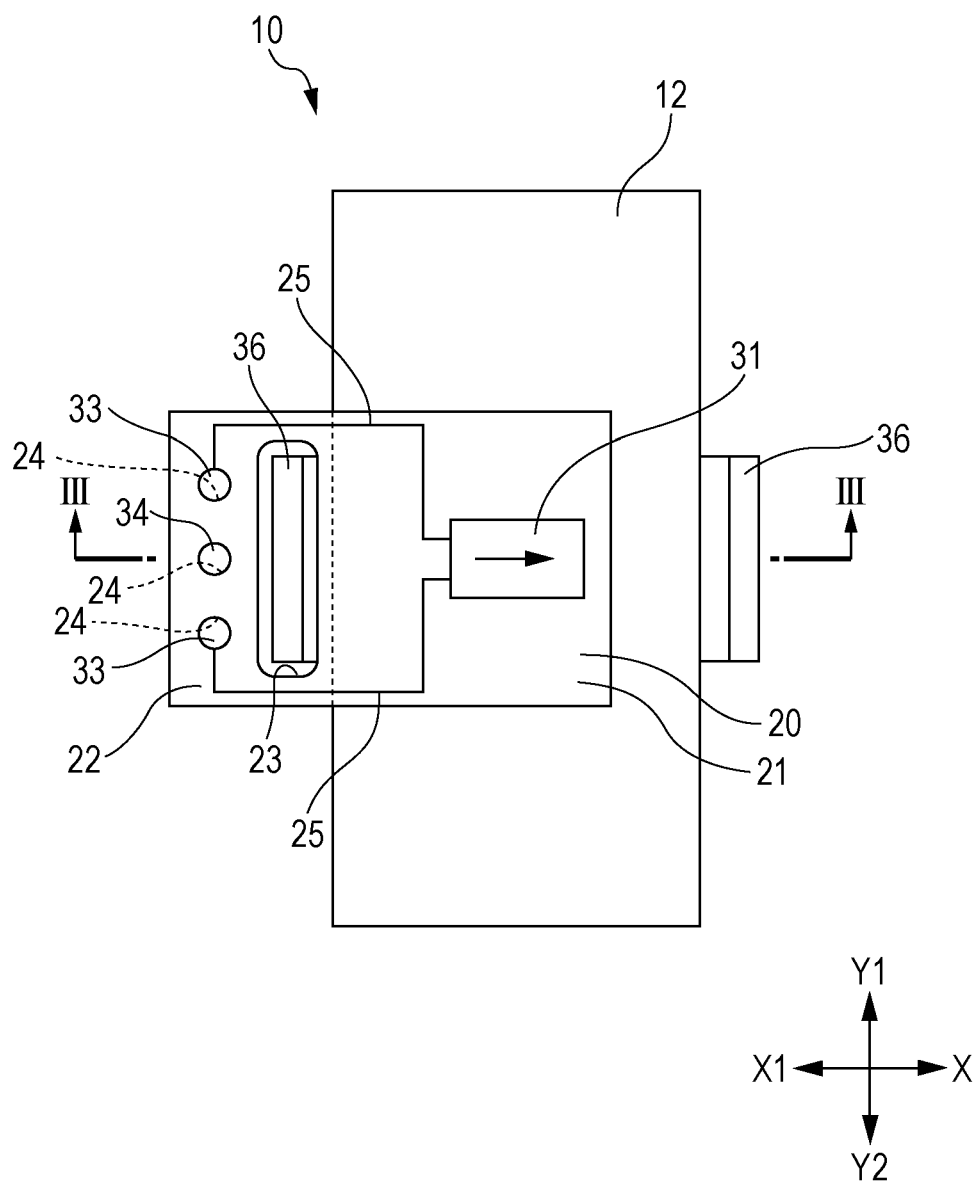
FIG. 2 is a plan view of the current sensor according to the first embodiment.

FIG. 1 is a perspective view of a current sensor according to a first embodiment. FIG. 2 is a plan view of the current sensor. In addition, FIG. 3 is a cross-sectional view taken along an III-III line in FIG. 2.

As shown in FIG. 1, the current sensor 10 according to the present embodiment includes a bus bar 12, a magnetic sensor element 31 disposed so as to face the bus bar 12, a wiring board 20 on which the magnetic sensor element 31 is provided, and signal lines 33 electrically connected to the magnetic sensor element 31. Furthermore, the current sensor 10 preferably includes a shield 36 surrounding the bus bar 12 and the magnetic sensor element 31.

As shown in FIGS. 1 and 2, the bus bar 12 is formed in a long plate shape, extends in a Y1-Y2 direction, and has a width direction in an X1-X2 direction. The bus bar 12 is formed from a conductive material such as a metallic material, an alloy material, or the like. When the current sensor 10 is used, both end portions, in the Y1-Y2 direction, of the bus bar 12 are connected to an external device (e.g., a motor or a battery of a vehicle, etc.) that is a measuring object, and a measured current is passed through the bus bar 12 in the Y1-Y2 direction.

Figure 3:
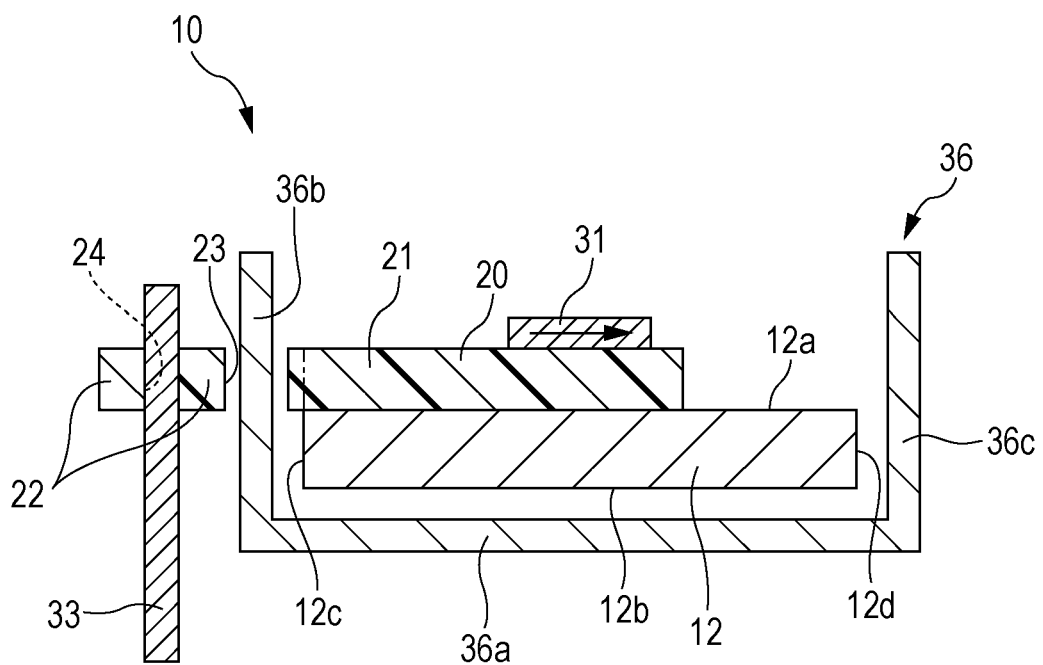
FIG. 3 is a cross-sectional view taken along an III-III line in FIG. 2.
Figure 3:
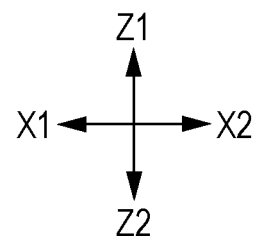

As shown in FIGS. 1 and 3, the magnetic sensor element 31 is provided so as to face a first surface 12a (a surface in a Z1 direction) of the bus bar 12. In the present embodiment, a magnetoresistance effect (GMR, Giant Magneto Resistance) element may be used as the magnetic sensor element 31, and, for example, a bridge circuit composed of a plurality of magnetoresistance effect elements is used.

An arrow provided to the magnetic sensor element 31 in each drawing indicates a sensitive axis direction of the magnetic sensor element 31, and the magnetic sensor element 31 is able to detect the intensity of a magnetic field in the sensitive axis direction. In the present embodiment, the sensitive axis is provided in a direction parallel to the width direction of the bus bar 12 (the X1-X2 direction), and a magnetic field generated by a measured current flowing through the bus bar 12 is detectable by the magnetic sensor element 31.

As shown in FIGS. 1 to 3, the magnetic sensor element 31 is provided on the wiring board 20 and disposed so as to face the bus bar 12 across the wiring board 20. As shown in FIGS. 1 to 3, the wiring board 20 includes a base portion 21 facing the bus bar 12 and an extending portion 22 extending from the base portion 21. As shown in FIG. 3, the wiring board 20 is provided on the first surface 12a of the bus bar 12, a portion thereof overlapping the bus bar 12 in a Z1-Z2 direction is the base portion 21, and a portion thereof extending outward (in an X1 direction) from the outer edge of the first surface 12a is the extending portion 22.

In the present embodiment, a printed wiring board (PWB) formed from a glass epoxy material or the like is used as the wiring board 20. In addition, a ceramic board such as an alumina board or the like may be used.

As shown in FIG. 2, a first through hole 23 and second through holes 24 are provided in the extending portion 22 of the wiring board 20. The first through hole 23 is formed in an elongate hole shape having a long axis in a direction in which the bus bar 12 extends (in the Y1-Y2 direction), and a plurality of the second through holes 24 are provided in the extending portion 22 and outward of the first through hole 23.

As shown in FIGS. 2 and 3, a plurality of the signal lines 33 are disposed through the second through holes 24 and connected to the extending portion 22 of the wiring board 20. The signal lines 33 are provided so as to extend in a direction intersecting the wiring board 20 (the Z1-Z2 direction). In other words, the signal lines 33 are provided at such positions as to not overlap the first surface 12a of the bus bar 12 and are provided in a direction intersecting the first surface 12a.

As shown in FIG. 2, the signal lines 33 and the magnetic sensor element 31 are electrically connected to each other via wires 25 drawn on the wiring board 20. An output signal detected by the magnetic sensor element 31 is outputted to an external control circuit (not shown) or the like via the signal lines 33. It should be noted that although omitted in FIGS. 1 and 2, in addition to the magnetic sensor element 31, components such as a resistor, a capacitor, and the like are mounted on the wiring board 20 to form a circuit, and a large number of wires that connect each component and are not shown are provided on the wiring board 20.

In the current sensor 10 according to the present embodiment, since the signal lines 33 are connected to the extending portion 22 provided in the wiring board 20, the signal lines 33 are provided in the direction intersecting the direction in which the bus bar 12 extends and are provided at positions away from the bus bar 12. Thus, it is possible to decrease the effective facing areas of the bus bar 12 and the signal lines 33 and to increase the distances between the bus bar 12 and the signal lines 33. Therefore, capacitive coupling between the bus bar 12 and the signal lines 33 is suppressed, and thus, even when voltage variation occurs in the bus bar 12, it is possible to suppress change in the output signal in the signal lines 33 with the voltage variation in the bus bar 12. In addition, since the intervals between the signal lines 33 and the bus bar 12 are increased, it is possible to suppress electromagnetic noise generated by a measured current flowing through the bus bar 12, from being superimposed on the signal lines 33.

Therefore, in the current sensor 10 according to the present embodiment, it is possible to reduce an output error.

As shown in FIGS. 2 and 3, in addition to the signal lines 33, a grounded ground line 34 is preferably connected to the extending portion 22. The ground line 34 is electrically connected to the magnetic sensor element 31 and to the circuit composed of the resistor and the like which are not shown. As shown in FIG. 3, similarly to the signal lines 33, the ground line 34 is connected to the extending portion 22 through one of the second through holes 24, and the signal lines 33 and the ground line 34 are arranged parallel to each other so as to be spaced apart from each other along the direction in which the bus bar 12 extends (the Y1-Y2 direction).

Since the signal lines 33 and the ground line 34 are arranged as described above, when electromagnetic noise enters from the outside or when electromagnetic noise generated by a measured current flowing through the bus bar 12 enters, the noise is equally superimposed on all the signal lines 33 and the ground line 34. Therefore, it is possible to easily cancel out the effect of the noise in each signal line 33 with a signal in the grounded ground line 34 as a reference, and thus it is possible to reduce an error in the output signal extracted from the signal lines 33.

In addition, as shown in FIGS. 2 and 3, the shield 36 is preferably provided between the bus bar 12 and the signal lines 33 so as to extend through the first through hole 23.

As shown in FIG. 3, the bus bar 12 is formed to have a rectangular cross-sectional shape and preferably has the first surface 12a facing the magnetic sensor element 31, a second surface 12b at the side opposite to the first surface 12a, and a pair of side surfaces 12c and 12d connecting the first surface 12a to the second surface 12b. The shield 36 includes a bottom portion 36a facing the second surface 12b and a pair of side portions 36b and 36c facing the pair of side surfaces 12c and 12d, and the bottom portion 36a and the pair of side portions 36b and 36c are connected to each other. In addition, the side portions 36b and 36c of the shield 36 are formed so as to extend to above the magnetic sensor element 31.

In the present embodiment, the shield 36 may be formed from a soft magnetic material such as a permalloy, a silicon steel plate, a Co-based amorphous material, or the like. In this case, the shield 36 is used as a magnetic shield. In addition, since these materials are conductive materials, the shield 36 has a function as an electromagnetic shield. Or, a shield 36 formed from a conductor such as a metallic material including Cu, Fe, or the like, an alloy material, or the like may be used as an electromagnetic shield.

As shown in FIGS. 1 to 3, the shield 36 is provided between the bus bar 12 and the signal lines 33. Thus, switching noise or the like from the bus bar 12 is blocked by the shield 36, and entry of noise into the signal lines 33 is suppressed.

In addition, the shield 36 is provided so as to surround the bus bar 12, and the side portions 36b and 36c of the shield 36 are provided so as to extend to above the magnetic sensor element 31. Thus, the magnetic sensor element 31 disposed so as to face the bus bar 12 is surrounded by the shield 36 downward (in the Z2 direction) and in the sensitive axis direction (the X1-X2 direction), of the magnetic sensor element 31 as shown in FIG. 3. Thus, it is possible to block magnetic noise generated by a current flowing through the signal lines 33, from entering the magnetic sensor element 31, and electromagnetic noise or the like from an external apparatus is also blocked by the shield 36. Therefore, it is possible to prevent false detection of the magnetic sensor element 31 and occurrence of an output error. Furthermore, the effect of the shield 36 blocking noise from the bus bar 12 or the like, from being radiated to the outside is also provided.

As shown in FIGS. 1 and 3, the length of the base portion 21 in the width direction of the bus bar 12 (the X1-X2 direction) is preferably set so as to be shorter than the width dimension of the bus bar 12. In other words, the base portion 21 is preferably disposed so as to face a portion, in the width direction, of the bus bar 12. Thus, it is possible to decrease the facing areas of the bus bar 12 and the wires 25 provided on the wiring board 20, as compared to the case where the base portion 21 is disposed so as to face the enter portion, in the width direction, of the bus bar 12. Therefore, it is possible to reduce capacitive coupling between the wires 25 and the bus bar 12, and hence it is possible to suppress the output signal passing through the wires 25, from changing due to voltage variation in the bus bar 12 or the like, thereby suppressing an output error.

It should be noted that in the current sensor 10 according to the present embodiment, a magnetoresistance effect (GMR (Giant Magneto Resistance)) is used as the magnetic sensor element 31, but the magnetic sensor element 31 is not limited thereto. For example, the magnetic sensor element 31 may be an AMR (Anisotropic Magneto Resistance) element, a TMR (Tunnel Magneto Resistance) element, a Hall element, or the like.

Figure 4:
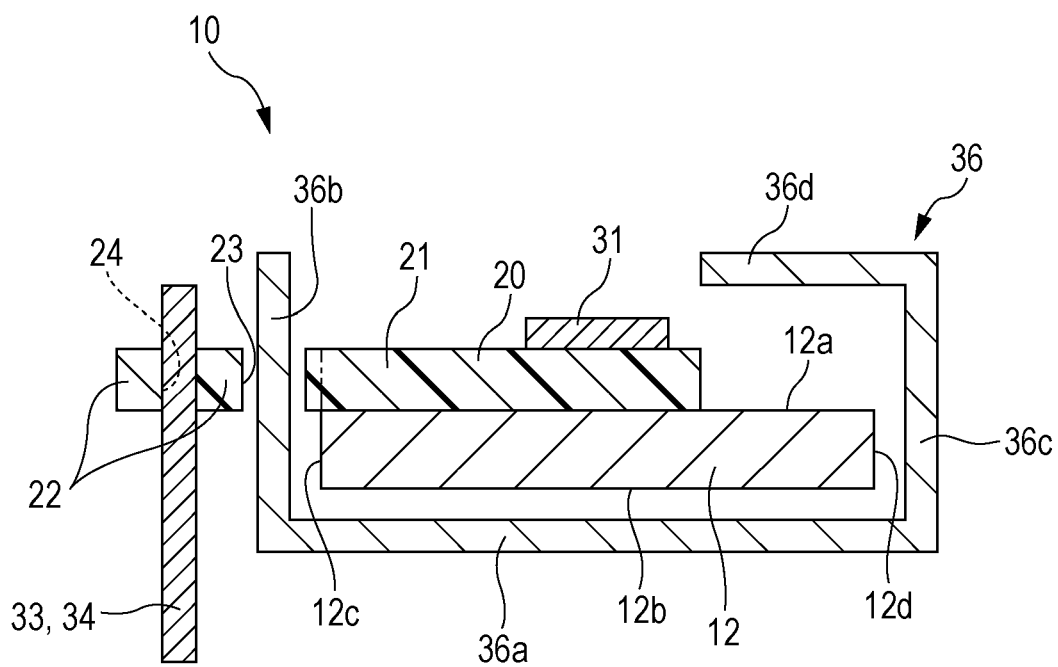
FIG. 4 is a cross-sectional view of a current sensor according to a first modification.
Figure 4:
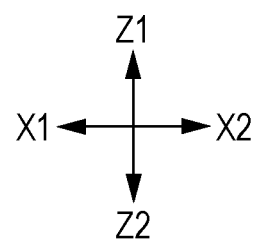

FIG. 4 is a cross-sectional view of a current sensor according to a first modification of the first embodiment. The current sensor 10 according to the first modification has a different configuration of the shield 36. It should be noted that components that are the same as those of the current sensor 10 shown in FIGS. 1 to 3 are designated by the same reference signs, and the detailed description thereof is omitted.

As shown in FIG. 4, in the current sensor 10 according to the present modification, the shield 36 is preferably configured to include a bent portion 36d that is formed so as to extend from an upper portion of the side portion 36c toward the bus bar 12 side. In other words, the bent portion 36d is preferably located above the magnetic sensor element 31 and provided so as to cover a portion of the first surface 12a of the bus bar 12. Thus, entry of external noise into the magnetic sensor element 31 is more effectively suppressed, and an output error is reduced. Or, it is possible to reduce radiation, to the outside, of electromagnetic noise generated by a current flowing through the bus bar 12.

Figure 5:
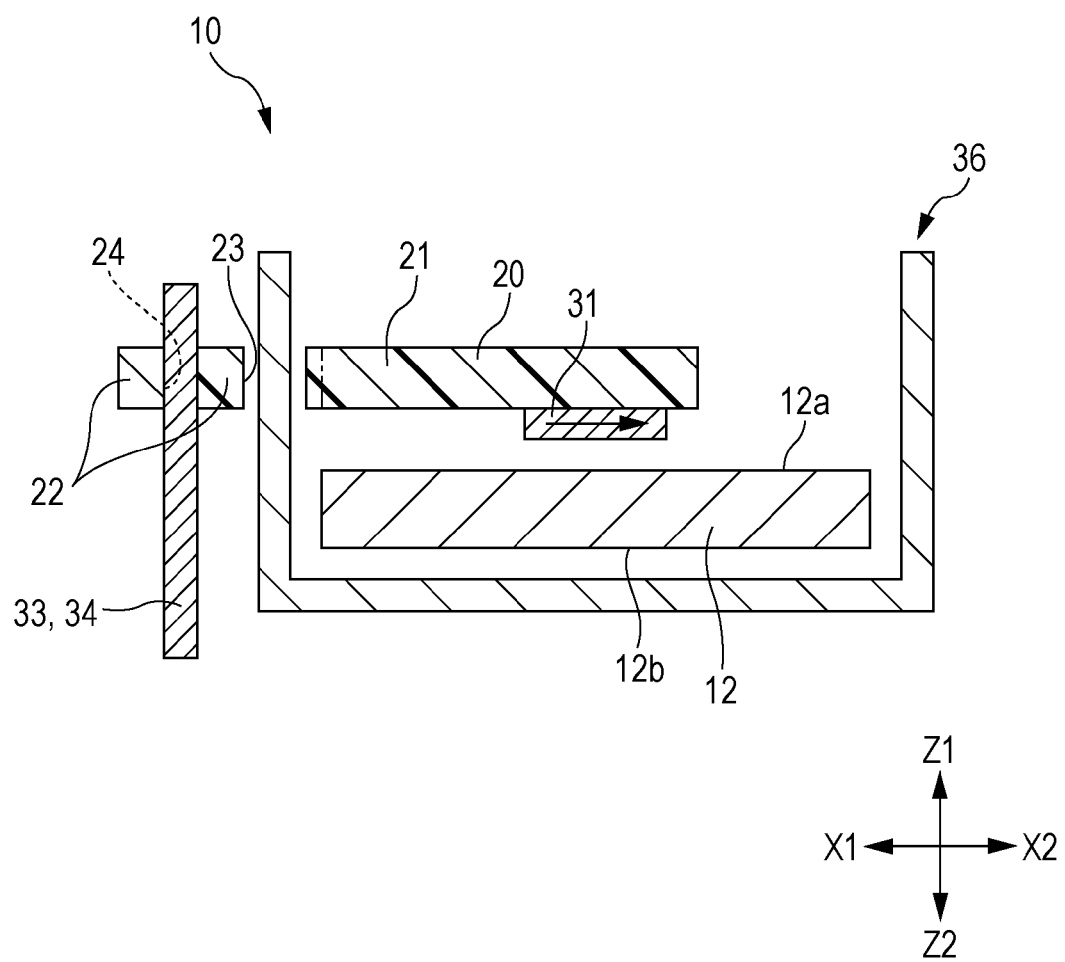
FIG. 5 is a cross-sectional view of a current sensor according to a second modification.

FIG. 5 is a cross-sectional view of a current sensor according to a second modification of the first embodiment. In the current sensor 10 shown in FIGS. 1 to 4, the wiring board 20 is disposed on the bus bar 12 and the magnetic sensor element 31 is disposed so as to face the bus bar 12 across the wiring board 20, but the present invention is not limited to such a configuration. As shown in FIG. 5, in the current sensor 10 according to the present modification, the wiring board 20 is disposed so as to face and be spaced apart from the bus bar 12, and the magnetic sensor element 31 is provided on the lower surface of the wiring board 20, namely, the surface thereof facing the bus bar 12. It should be noted that each of the wiring board 20 and the bus bar 12 is supported by and fixed to a housing which is not shown.

As shown in FIG. 5, the magnetic sensor element 31 is disposed so as to face and be spaced apart from the bus bar 12, and the wiring board 20 is not provided between the magnetic sensor element 31 and the bus bar 12. Thus, it is possible to accurately measure a magnetic field generated by a measured current flowing through the bus bar 12.

In addition, even with such a configuration, similarly to the first embodiment shown in FIGS. 1 to 3, it is possible to connect the signal lines 33 to the extending portion 22 of the wiring board 20 to suppress capacitive coupling between the bus bar 12 and the signal lines 33, thereby reducing an output error.

Second Embodiment

Figure 6:
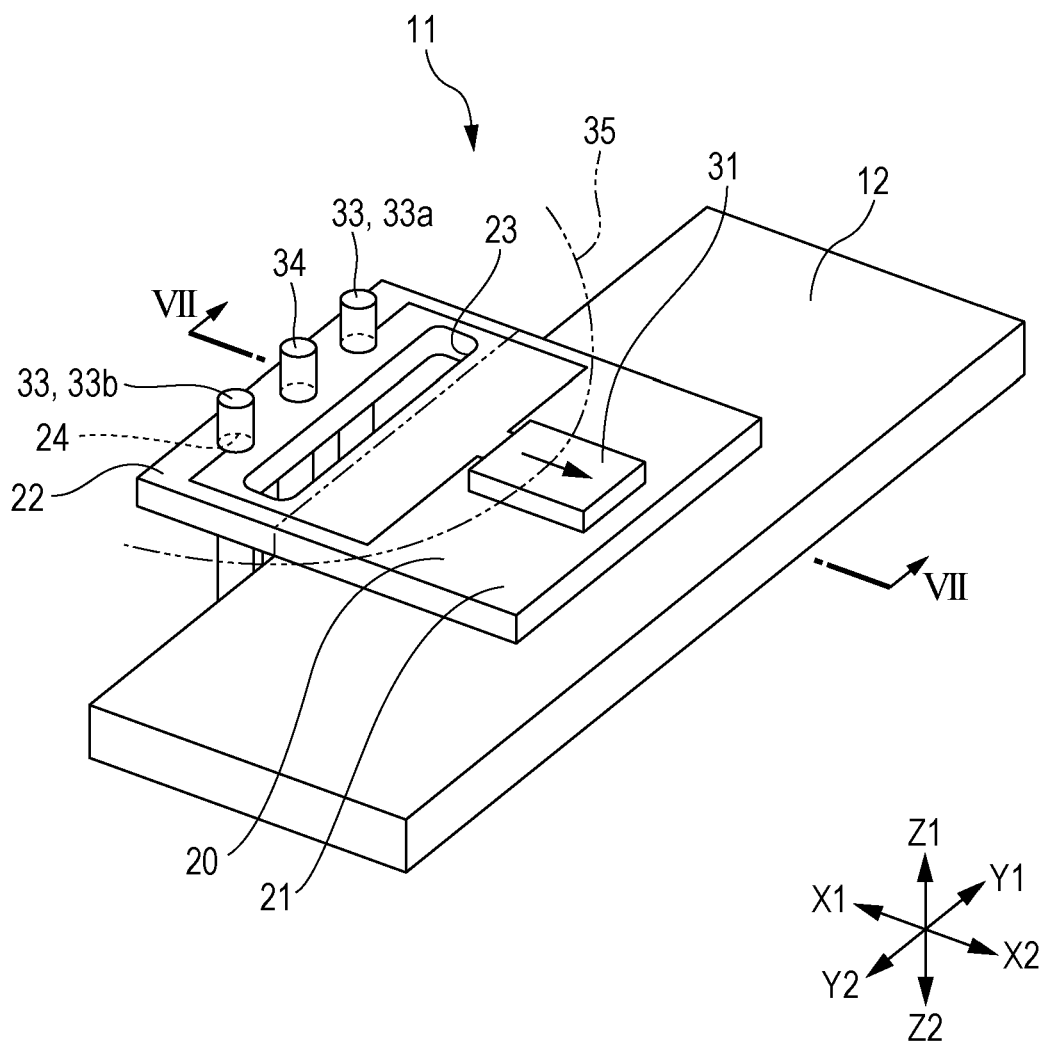
FIG. 6 is a perspective view of a current sensor according to a second embodiment of the present invention.
Figure 7:
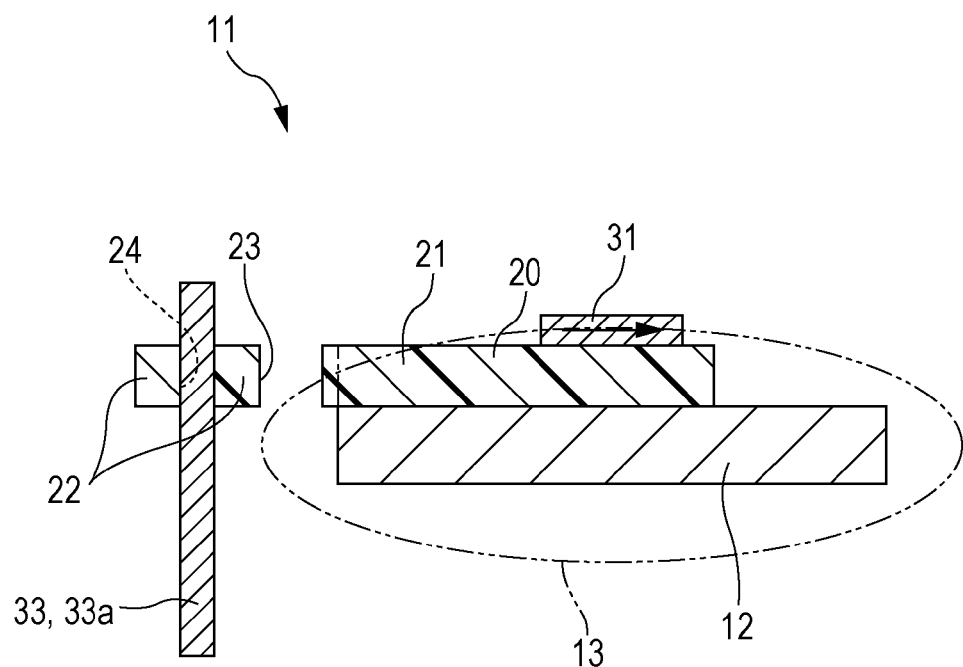
FIG. 7 is a cross-sectional view taken along a VII-VII line in FIG. 6.
Figure 7:
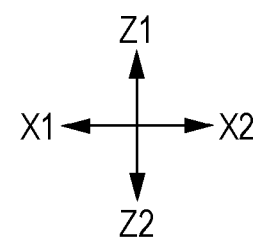
Figure 8:
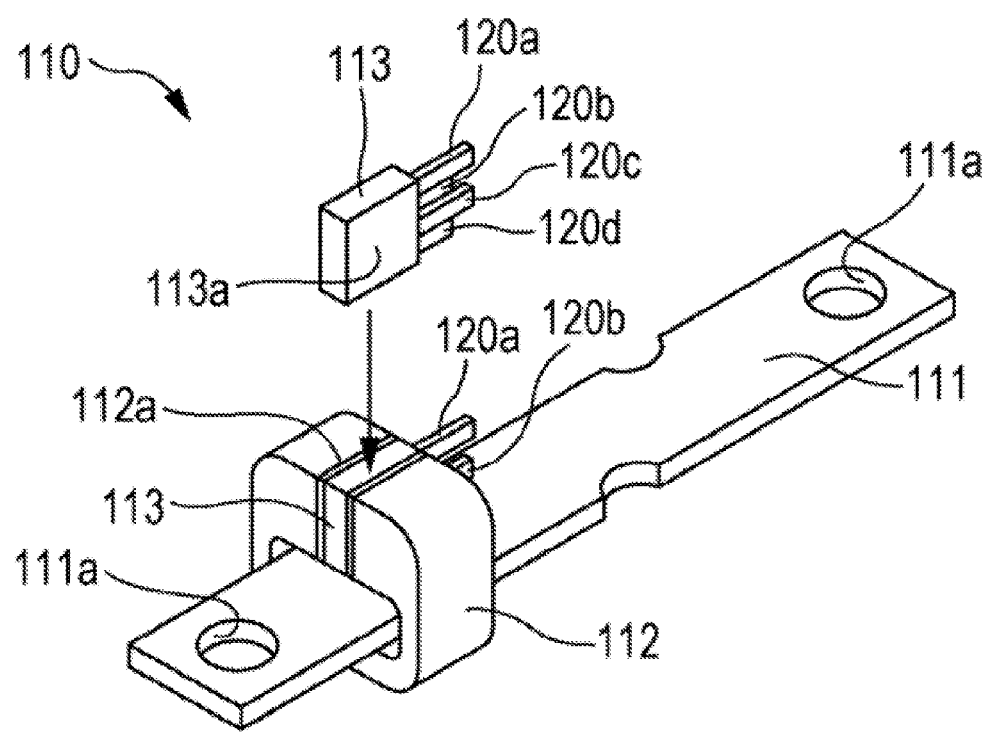
FIG. 8 is a perspective view of a current sensor of the related art.

FIG. 6 is a perspective view of a current sensor according to a second embodiment. In addition, FIG. 7 is a cross-sectional view of the current sensor taken along a VII-VII line in FIG. 6. As shown in FIGS. 6 and 7, the current sensor 11 according to the present embodiment is different in that the shield 36 is not provided, and the other configuration is the same as that in the first embodiment shown in FIGS. 1 to 3.

As shown in FIGS. 6 and 7, in the current sensor 11 according to the present embodiment as well, the wiring board 20 includes the base portion 21 facing the bus bar 12 and the extending portion 22 extending from the base portion 21, and the signal lines 33 are connected to the extending portion 22. In other words, the signal lines 33 are provided in the direction intersecting the direction in which the bus bar 12 extends and are provided at positions away from the bus bar 12. Thus, capacitive coupling between the bus bar 12 and the signal lines 33 is suppressed, and hence even when voltage variation occurs in the bus bar 12, it is possible to suppress the output signal in the signal lines 33 from changing due to the voltage variation in the bus bar 12. In addition, since the intervals between the signal lines 33 and the bus bar 12 are increased, it is possible to suppress electromagnetic noise generated by a measured current flowing through the bus bar 12, from being superimposed on the signal lines 33.

Therefore, in the current sensor 11 according to the present embodiment, it is possible to reduce an output error.

In addition, the magnetic sensor element 31 has a sensitive axis for detecting a magnetic field, and the sensitive axis is indicated by an arrow provided to the magnetic sensor element 31 in FIGS. 6 and 7. As shown in FIG. 7, a virtual ellipse having a center at the center of a cross section of the bus bar 12 and having a major axis extending in the width direction of the bus bar 12 (the X1-X2 direction) is defined as a first virtual circle 13. The sensitive axis of the magnetic sensor element 31 is provided in the circumferential direction of the first virtual circle 13. In addition, as shown in FIG. 6, when a virtual circle having a center at the center of a cross section of the signal line 33 (e.g., a signal line 33a) is defined as a second virtual circle 35, the sensitive axis of the magnetic sensor element 31 is provided in a direction intersecting the second virtual circle 35.

Thus, a magnetic flux generated by a measured current flowing through the bus bar 12 passes through the magnetic sensor element 31 in the sensitive axis direction, and a magnetic flux generated by a current flowing through each signal line 33 passes through the magnetic sensor element 31 in a direction intersecting the sensitive axis direction. Therefore, the magnetic flux generated by the measured current is sensitively detected, and almost no magnetic flux generated by the current flowing through each signal line 33 is detected. Thus, it is possible to reduce an output error generated by the current flowing through each signal line 33.

As shown in FIGS. 6 and 7, in the present embodiment as well, a grounded ground line 34 is provided in addition to the signal lines 33. The ground line 34 is electrically connected to the magnetic sensor element 31 and a circuit composed of a resistor and the like which are not shown. As shown in FIG. 6, the signal lines 33 and the ground line 34 are preferably arranged parallel to each other so as to be spaced apart from each other along the direction in which the bus bar 12 extends (the Y1-Y2 direction).

In the extending portion 22, a first through hole 23 is preferably formed between the bus bar 12 and the signal lines 33 and the ground line 34. The first through hole 23 is formed in an elongate hole shape having a long axis in the direction in which the bus bar 12 extends (the Y1-Y2 direction).

Since the first through hole 23 is provided, the volume of a resin material (an epoxy resin forming the wiring board 20) present between the signal lines 33 and the bus bar 12 and between the ground line 34 and the bus bar 12 is decreased. Thus, it is possible to reduce a dielectric constant between the bus bar 12 and the signal lines 33, thereby suppressing capacitive coupling between the bus bar 12 and the signal lines 33. Therefore, it is possible to reduce an output error caused due to voltage variation in the bus bar 12.

What is claimed is:

1. A current sensor comprising:
a bus bar extending in a first direction;
a wiring board including:
a base portion facing a main surface of the bus bar; and
an extending portion extending from the base portion and not facing the main surface of the bus bar;
a magnetic sensor element disposed on the base portion of the wiring board;
a signal line electrically connected to the magnetic sensor element via a wiring on the wiring board, the signal line being coupled to the extending portion and extending in a second direction intersecting the first direction;
a through hole formed in the extending portion between the bus bar and the signal line; and
a shield provided between the bus bar and the signal line so as to extend through the through hole, wherein the shield is formed of a soft magnetic material which is also a conductive material.

2. The current sensor according to claim 1, wherein the bus bar includes:
a first surface which is the main surface facing the wiring board;
a second surface formed at an opposite side of the first surface; and
a pair of side surfaces formed between and connecting the first surface and the second surface,
and wherein the shield includes a main portion facing the second surface and a pair of side portions facing the pair of side surfaces, one of the pair of side portions extending through the through hole.

3. The current sensor according to claim 2, wherein the shield further includes a bent portion extending from the other of the pair of side portions and partially covering the first surface of the bus bar.

4. The current sensor according to claim 1, further comprising:

a plurality of signal lines including the signal line, coupled to the extending portion; and a grounded ground line coupled to the extending portion, wherein the plurality of signal lines and the ground line are arranged in the first direction.

5. The current sensor according to claim 1, wherein a length of the base portion in a width direction of the bus bar is shorter than a width of the bus bar.

6. The current sensor according to claim 1, wherein the magnetic sensor is disposed on the base portion of the wiring board so as to directly face the bus bar.

7. The current sensor according to claim 1, wherein the magnetic sensor is disposed on the base portion of the wiring board so as to face the bus bar via the wiring board.

8. The current sensor according to claim 1, wherein the bus bar allows a current to be measured to flow therethrough along the first direction.

9. A current sensor comprising:

a bus bar extending in a first direction;

a wiring board including:
   a base portion facing a main surface of the bus bar; and
   an extending portion extending from the base portion and not facing the main surface of the bus bar;

a magnetic sensor element disposed on the base portion of the wiring board;

a signal line electrically connected to the magnetic sensor element via a wiring on the wiring board, the signal line being coupled to the extending portion and extending in a second direction intersecting the first direction;

a through hole formed in the extending portion between the bus bar and the signal line; and a shield formed of a conductor provided between the bus bar and the signal line so as to extend through the through hole, thereby blocking electromagnetic noise generated by a current flowing through the bus bar from entering the signal line.

\* \* \* \* \*